United States Patent [19]

Vasquez

[11] Patent Number: 5,185,647
[45] Date of Patent: Feb. 9, 1993

[54] LONG WAVELENGTH INFRARED DETECTOR

[75] Inventor: Richard P. Vasquez, Duarte, Calif.

[73] Assignee: The United States of America as represented by the Administrator of the National Aeronautics and Space Administration, Washington, D.C.

[21] Appl. No.: 562,176

[22] Filed: Sep. 25, 1990

Related U.S. Application Data

[63] Continuation of Ser. No. 283,443, Dec. 12, 1988, abandoned.

[51] Int. Cl.$^5$ .................. H01L 27/12; H01L 29/161; H01L 27/14
[52] U.S. Cl. ........................................ 257/17; 257/21; 257/23
[58] Field of Search ................. 357/4 SC, 4, 16, 17, 357/30 B

[56] References Cited

U.S. PATENT DOCUMENTS

| | | | |
|---|---|---|---|
| 3,739,385 | 4/1980 | Bethea et al. | 357/30 |
| 4,205,331 | 5/1980 | Esaki et al. | 357/30 |
| 4,228,365 | 10/1980 | Gutierrez et al. | 307/221 |
| 4,383,269 | 5/1983 | Capasso | 357/30 |
| 4,620,214 | 10/1986 | Margalit et al. | 357/16 |
| 4,665,412 | 5/1987 | Ohkawa et al. | 357/4 |
| 4,679,063 | 7/1987 | White | 357/30 |
| 4,720,309 | 1/1988 | Deveaud et al. | 148/33.1 |
| 4,745,452 | 5/1988 | Sollner | 357/30 |
| 4,806,993 | 2/1989 | Voisin et al. | 357/4 |
| 4,894,526 | 1/1990 | Bethea et al. | 357/4 |
| 4,903,101 | 2/1990 | Maserjian | 357/30 |

OTHER PUBLICATIONS

Levine, B. F., Choi, K. K., Bethea, C. G., Walker, J., Malik, R. J., "New 10 μm infrared detector using intersubband absorption in resonant tunneling GaAlAs superlattices," Appl. Phys. Lett. 50(16), pp. 1092–1094, Apr. 20, 1987.
Alex Harwit and J. S. Harris, Jr., "Observation of Stark shifts in quantum well intersubband transitions," Appl. Phys. Lett. 50(11), pp. 685–687, Mar. 16, 1987.
K. K. Choi et al., "Multiple quantum well 10 μm GaAs-/Al$_x$Ga$_{1-x}$As infrared detector with improved responsivity," Appl. Phys. Lett. 50(25), pp. 1814–1816, Jun. 22, 1987.
L. C. West, "First observation of an extremely large-dipole infrared transition within the conduction band of a GaAs quantum well," Appl. Phys. Lett. 46(12), pp. 1156–1158, Jun. 15, 1985.
B. F. Levine et al., "Quantum well avalanche multiplication initiated by 10 μm intersubband absorption and photoexcited tunneling," Appl. Phys. Lett. 51(12), pp. 934–936, Sep. 21, 1987.
Levine, "New 10 μm intrared detector using intersubband absorption...", Appl. Phys. Lett. vol. 50, No. 16, Apr. 20, 1987, p. 1092.
Anderson, "Modern Physics & Quantum Mechanics", pp. 174–176.
Sze, *Semiconductor Devices, Physics and Technology*, pp. 252–255, ©1985.
G. H. Döhler, "Solid-State Superlattice", pp. 144–151 of Scientific American, Nov. 1983.
G. H. Döhler, "Doping Superlattice", pp. 851–856, American Vacuum Society, May/Jun. 1979.

*Primary Examiner*—Andrew J. James
*Assistant Examiner*—Ngan Van Ngo
*Attorney, Agent, or Firm*—Thomas H. Jones; John H. Kusmiss; Guy M. Miller

[57] ABSTRACT

Long wavelength infrared detection is achieved by a detector made with layers of quantum well material bounded on each side by barrier material to form paired quantum wells, each quantum well having a single energy level. The width and depth of the paired quantum wells, and the spacing therebetween, are selected to split the single energy level with an upper energy level near the top of the energy wells. The spacing is selected for splitting the single energy level into two energy levels with a difference between levels sufficiently small for detection of infrared radiation of a desired wavelength.

7 Claims, 2 Drawing Sheets

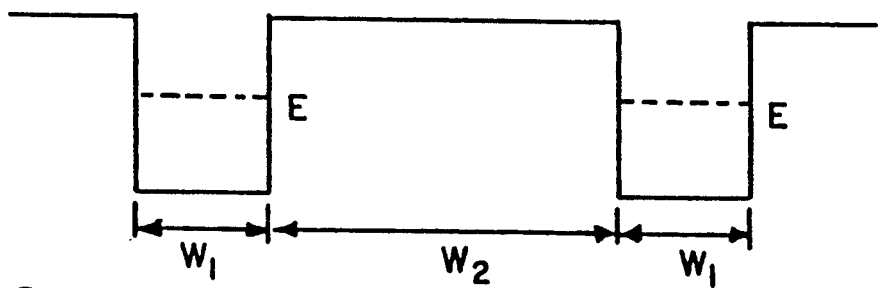
FIG. 4a
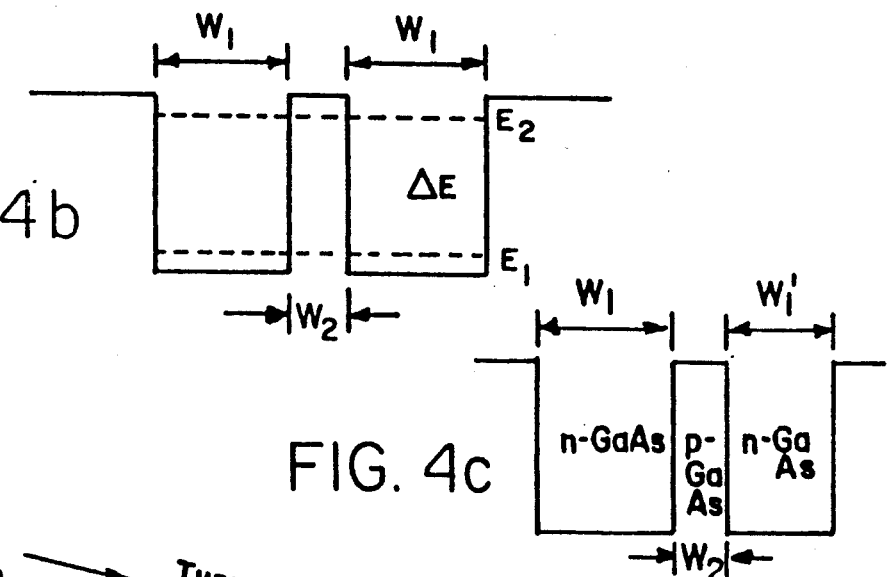
FIG. 4b
FIG. 4c
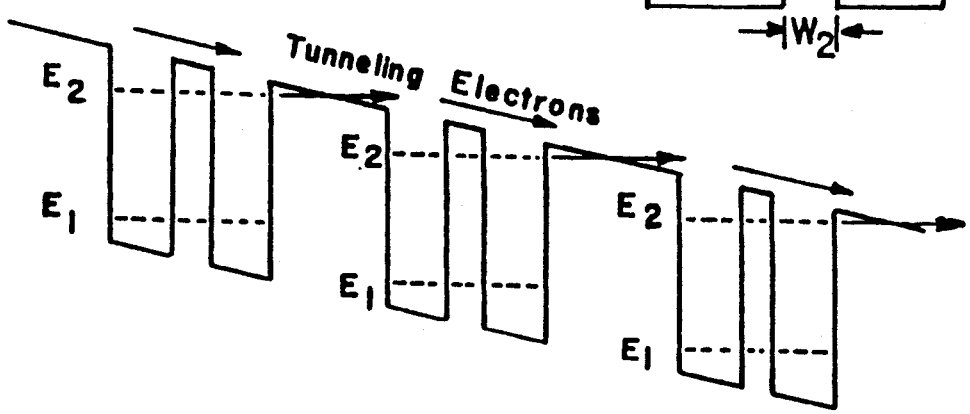
FIG. 5

LONG WAVELENGTH INFRARED DETECTOR

ORIGIN OF THE INVENTION

The invention described herein was made in the performance of work under a NASA contract, and is subject to the provisions of Public Law 96-517 (35 USC 202) in which the Contractor has elected not to retain title.

This application is a continuation of application Ser. No. 07/283,443, filed Dec. 12, 1988, now abandoned.

TECHNICAL FIELD

The invention relates to infrared (IR) detectors using III-V compound semiconductors, such as gallium arsenide/aluminum arsenide, or any other combination of materials that exhibit quantum confinement effects, such as silicon/cobalt disilicide or silicon-germanium alloys, and more particularly to a method of making, and structure for, detectors using intersubband absorption in coupled quantum wells to achieve long wavelength IR detection in the range of about 10 $\mu$m to 100 $\mu$m.

BACKGROUND ART

There is a major need in space and military applications for infrared detectors. A great deal of research has focused on the possibility of using II-VI compounds, such as $Hg_xCd_{1-x}Te$, to fabricate intrinsic semiconductor long wavelength IR detectors. The interest in these materials is motivated by the fact that the alloy changes from semiconducting to semimetallic as a function of composition. Thus, the bandgap, which is determined by the alloy composition, is narrow and can be reduced to zero for appropriate alloy compositions. However, current attempts to achieve IR detection with II-VI compounds have materials problems inherent in their chemistry, as well as immature growth and processing technologies.

The use of III-V compound semiconductors or other material systems would be preferable in view of the more mature growth and processing technologies available, as well as superior materials properties inherent in their chemistry, but IR detection in these materials has only been demonstrated in $Al_xGa_{1-x}As$ for wavelengths of 8 to 11 $\mu$m. These smaller wavelength detectors were based on IR absorption between the ground state and the first excited state of quantum wells formed by the conduction band discontinuity between the GaAs wells and $Al_xGa_{1-x}As$ barriers. The photoexcited carriers tunnel out of the wells and are collected with the aid of an applied electric field.

The wavelength at which the detector operates is determined by the energy difference between the ground and first excited states. The requirement that the excited state be near the top of the well for efficient tunneling places restrictions on the range of alloy compositions and well widths which are suitable. In addition, a design for narrow bandwidth operation requires that the well width be ~100 Å or greater in order to minimize energy level broadening caused by the inevitable fluctuations in alloy composition, placing a further restriction on growth parameters. Finally, a relatively large well width and/or barrier height is required in order for a well to have an excited state in addition to the ground state.

STATEMENT OF THE INVENTION

An object of this invention is to provide IR detectors for wavelengths in a range greater than about 10 $\mu$m, and up to about 100 $\mu$m, using materials which exhibit quantum confinement effects.

The present invention provides an IR detector of wavelengths in the aforesaid range based on photon energy absorption between two energy levels of coupled quantum wells, where each well is formed by the conduction band discontinuity between materials which exhibit quantum confinement effects, such as GaAs with barrier material between the wells, such as $Al_xGa_{1-x}As$, and where the wells are provided in pairs with a well width, $W_1$, and a barrier width, $W_2$, between wells. While $GaAs/Al_xGa_{1-x}As$ is used as an example, it is understood that any combination of materials which exhibit quantum confinement effects would be suitable, or the same material for the quantum wells and barriers with doping modulation. The well spacing $W_2$ is selected to so provide coupling between paired wells as to split a single energy level, E, in the paired quantum wells into two, $E_1$ and $E_2$, by interaction. The difference, $\Delta E$, between the two energy levels $E_1$ and $E_2$ is reduced for increased wavelength detection. Thus, by varying the well spacing $W_2$ between paired quantum wells, $\Delta E$ can be made smaller for longer wavelength detection. Such a structure of coupled quantum wells is repeated to improve absorption, i.e., sensitivity to IR radiation incident on the detector, and an electric field may be applied to collect the photoexcited carriers.

BRIEF DESCRIPTION OF THE DRAWINGS

FIGS. 4a and 4b are energy level diagrams which are useful in understanding the principle of the present invention of coupling quantum wells having a single energy level, E, as shown in FIG. 4a, by so reducing the spacing, $W_2$, between quantum wells as to split the single energy level into two levels, $E_1$ $E_2$, as shown in FIG. 4b, and FIG. 4c illustrates a variation of paired quantum wells of different widths $W_1$ and $W'_1$, and yet another variation of using the same material for the wells and barrier with doping modulation.

FIG. 5 is a conduction band diagram of the present invention in FIG. 1 illustrating photoconductivity produced by absorption of intersubband radiation and tunneling of photoexcited electrons out of the wells.

DETAILED DESCRIPTION OF THE INVENTION

An example of one embodiment of the invention will now be described with reference to FIG. 1. A long wavelength IR detector 10 is shown comprised of paired layers 11 and 12 of semiconductor material 13, such as GaAs, bounded by barrier material, such as $Al_xGa_{1-x}As$. The width of each paired layer of semiconductor material is $W_1$ and the spacing between the paired layers is $W_2$, where $W_2$ is selected for the desired wavelength of IR radiation to be detected. FIG. 2 illustrates an energy level diagram for the coupled quantum wells of the layered structure in FIG. 1.

Figure 3:
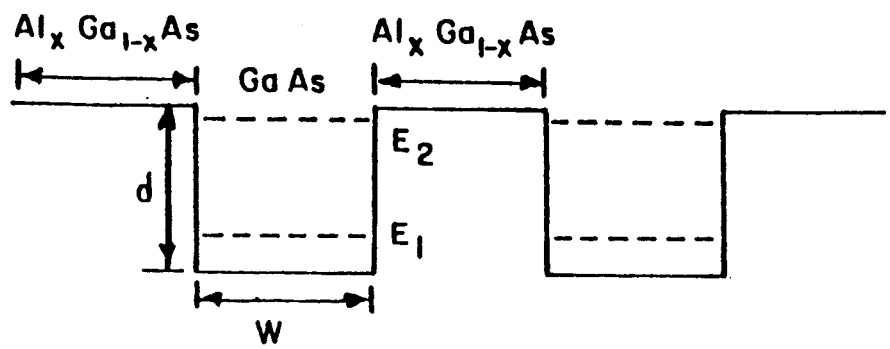
FIG. 3 is a typical energy level diagram of a conventional IR detector using III-V material to form uniformly spaced quantum wells.

In the prior art, similar layered structures were provided to form quantum wells having two quantized energy levels, as shown in FIG. 3, $E_1$ with a symmetric wave function and $E_2$ with an antisymmetric wave function. To achieve the two energy levels, the depth, d, and/or width, W, of each quantum well must be relatively large, for example $d \approx 200$ meV, $W \approx 65$ Å. See B. F. Levine, K. K. Choi, C. G. Bethea, J. Walker and R. J. Malik, "New 10 μm infrared detector using intersubband absorption in resonant tunneling GaAlAs superlatices," Appl. Phys. Lett. 50, 1092 (1987). The basic quantum well structure is then repeated many times with large uniform spacing.

The principle of the present invention is to provide a reduced difference $\Delta E$ of the quantum well energy levels $E_1$ $E_2$, in order to increase the wavelength of IR absorption, and to form the required symmetric and antisymmetric wave functions by using a physical principle which is fundamentally different from that used in the prior art. This is accomplished by using coupled quantum wells in pairs, as described with reference to FIGS. 1 and 2.

The manner of achieving coupling between quantum wells for a reduced $\Delta E$ will now be described with reference to FIGS. 4a and 4b. In FIG. 4a, there is first shown an energy level diagram of two quantum wells formed with only a single quantized energy level E. By reducing the spacing $W_2$ between the quantum wells until coupling between the wells is achieved (i.e., until the overlap of the wave functions is significant), the single energy level E is split into two levels $E_1$ and $E_2$, as shown in FIG. 4b. This coupling between the wave functions of the quantized energy levels in the paired wells is a function of the spacing or distance $W_2$ between the wells.

The corresponding isolated wells have the same single energy level E when the spacing $W_2$ between the wells is large, as illustrated in FIG. 4a. However, as the spacing $W_2$ is decreased, the wave function in the paired wells interact resulting in the formation of a symmetric and an antisymmetric wave function, and the energy levels split in a manner analogous to the formation of bonding and antibonding orbitals of molecular hydrogen from the atomic orbitals. The energy $E_1$ lies below the single energy level E and has a symmetric wave function, and the energy $E_2$ lies above the single energy level E and has an antisymmetric wave function.

It should be noted that the required symmetric and antisymmetric wave functions, and the energy level splitting between them, are being formed in the present invention as a result of coupling between paired quantum wells, rather than being formed as an intrinsic property of an individual well, as is done in the prior art. The present invention is thus based on a fundamentally different physical principle than the prior art. While this energy splitting phenomenon is well known in the chemical arts, its application to the technical field of this invention is new and useful. A variation is to use two quantum wells with different widths, $W_1$ and $W'_1$ as shown in FIG. 4c, producing asymmetric (rather than symmetric and antisymmetric) wave functions. Another variation is to use one material with modulation doping, such as N-GaAs for the wells and P-GaAs for the barriers. Such an NIPI structure is also illustrated in FIG. 4c as an alternative way to implement the wells coupled in pairs.

When the two quantum wells are sufficiently close that their wave functions overlap, energy level splitting occurs analogous to the formation of bonding and antibonding orbitals in molecular hydrogen which are formed from the atomic orbitals. Since the degree of wave function overlap, and hence the energy level splitting, can be varied by varying the spacing (barrier width) $W_2$ between the two coupled wells, a detector can be designed to operate at an arbitrary wavelength, as demonstrated by the following tables I and II.

TABLE I

| $W_1 = 70$Å | | | | $d = 50$ meV |
|---|---|---|---|---|
| $W_2$(Å) | $E_1$(meV) | $E_2$(meV) | $\Delta E$(meV) | $\lambda$(μm) |
| 14 | 16.5 | 39.9 | 23.4 | 53 |
| 17 | 17.2 | 39.2 | 22 | 56.4 |
| 20 | 17.8 | 38.4 | 20.6 | 60.2 |
| 22.6 | 18.2 | 37.8 | 19.6 | 63.3 |
| 25.5 | 18.7 | 37.2 | 18.5 | 67 |
| 28.3 | 19.2 | 36.6 | 17.4 | 71.3 |
| 31.1 | 19.6 | 36 | 16.4 | 75.6 |
| 34 | 20 | 35.5 | 15.5 | 80 |
| 36.8 | 20.4 | 34.9 | 14.5 | 85.5 |
| 39.6 | 20.7 | 34.4 | 13.7 | 90.5 |
| 42.5 | 21 | 34 | 13 | 95.4 |

TABLE II

| $W_1 = 42.5$Å | | | | $d = 100$ meV |
|---|---|---|---|---|
| $W_2$(Å) | $E_1$(meV) | $E_2$(meV) | $\Delta E$(meV) | $\lambda$(μm) |
| 14 | 40.8 | 87.4 | 46.6 | 26.6 |
| 17 | 42.4 | 85.4 | 43 | 28.8 |
| 19.8 | 43.7 | 83.5 | 39.8 | 31.2 |
| 22.6 | 44.9 | 81.8 | 36.9 | 33.6 |
| 25.5 | 46.1 | 80.1 | 34 | 36.5 |
| 28.3 | 47 | 78.5 | 31.5 | 39.4 |
| 31.3 | 48 | 77 | 29 | 42.8 |
| 34 | 48.8 | 75.6 | 26.8 | 46.3 |
| 36.8 | 49.6 | 74.4 | 24.8 | 50 |

The barrier material used for the GaAs quantum wells in Table I was $Al_{0.06}Ga_{0.94}As$. The depth d of the wells was maintained constant (50 meV) as was the width of the wells (70Å). The wavelength detection data shows that as the width $W_2$ of the barrier material is increased, the difference $\Delta E$ in the split energy levels $E_1$ and $E_2$ decreases while the wavelength $\lambda$ increases. For a shorter range of wavelengths shown in Table II, the concentration of Al in the barrier material was increased to increase the difference $\Delta E$ in the split energy levels $E_1$ and $E_2$ to a range greater than the range of $\Delta E$ in Table I. Then, by varying $W_2$ in nine steps, very similar to the eleven steps in Table I, and changing the well width $W_1$ and depth d to 42.5 Å and 100 meV, the wavelength response was increased progressively from 26.6 μm to 50 μm, a range below the wavelength range of 53 to 95.4 μm in Table I. From this data it is evident that for about the same range of well spacing, $W_2$, a different range of wavelength detection is achieved by varying the width and depth of the quantum wells. For longer wavelengths, the quantum well should be wider, and the depth should be less, but by increasing the spacing between paired quantum wells of the same parameters $W_1$ and d the wavelength detection increases, so that an IR detector may be designed for a desired wavelength of detected radiation. The reason the range of longer wavelength (Table I) is designed with a greater width $W_1$ and a smaller depth d is that for tunneling of photoexcited electrons, the upper level $E_2$ must be near the top of the quantum well, as may be appreciated from the discussion below with reference to FIG. 5.

It is thus evident from the Tables I and II that for the present invention to work in the 10 to 100 μm wavelength range, energy level splittings of 12 to 120 meV are required, such as for example, an energy level splitting of 23.4 meV obtained using 70 Å thick GaAs wells, $Al_{0.06}Ga_{0.94}As$ barriers, and a width $W_2$ for the barrier between the wells of 14 Å (Table I). Then by varying the spacing $W_2$, the difference $\Delta E$ between the split levels $E_1$ and $E_2$ can, in principle, be made arbitrarily small to increase the wavelength of IR absorption. However, the spacing $W_2$ can, in practice, be reduced from the large thickness of the prior art (~65 Å) to a minimum of about 10 Å, but increasing $W_2$ can increase the wavelength of IR detected from about 10 μm to about 100 μm, provided the well width and depth is properly selected.

Figure 1:
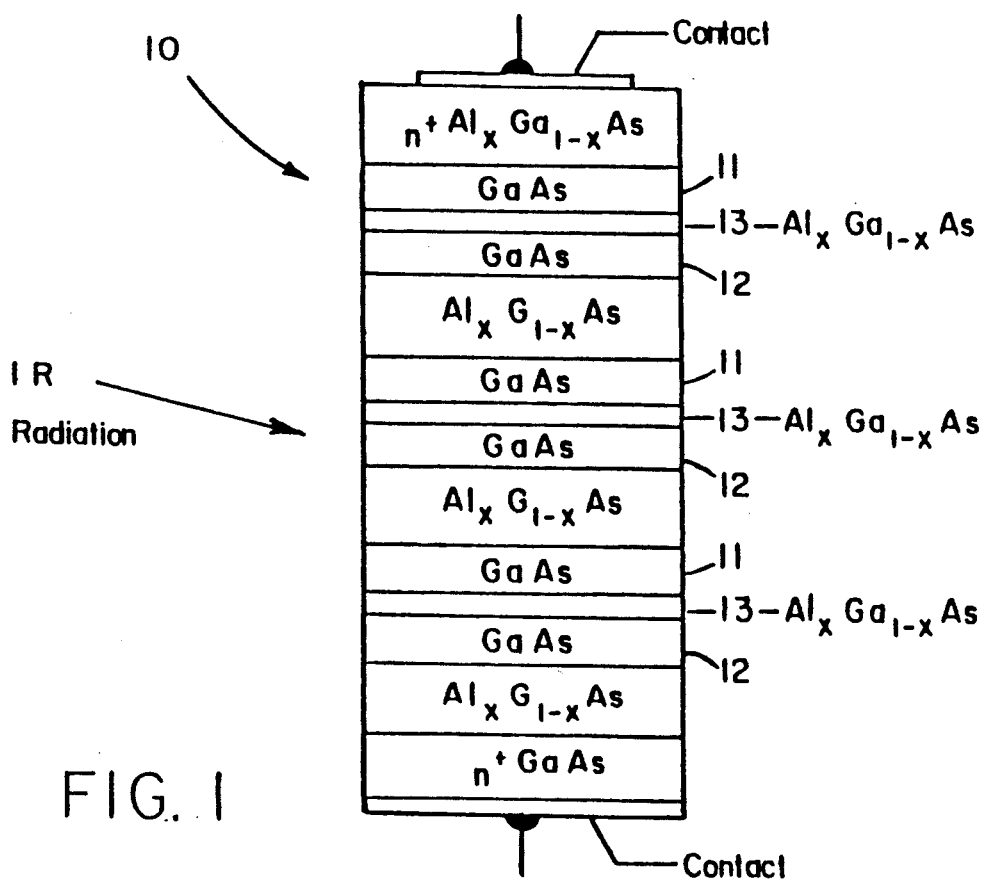
FIG. 1 illustrates schematically an example of an embodiment of the present invention comprising several paired quantum well layers of III-V material, namely GaAs bounded by barrier layers of $Al_xGa_{1-x}As$.
Figure 2:
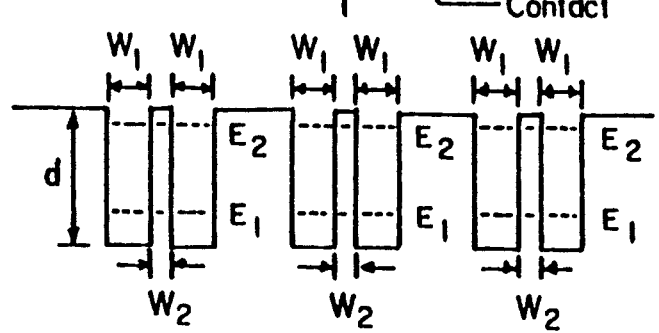
FIG. 2 is an energy level diagram of the structure of FIG. 1.

FIG. 5 illustrates a conduction band diagram for the structure of FIG. 1 with an electric field applied to provide avalanche gain from the intersubband absorption of IR radiation to produce photoexcited electrons, and tunneling of the electrons into an adjacent quantum well where impact ionization produces more electrons, thus producing avalanche gain. See B. F. Levine, K. K. Choi, C. G. Bethea, J. Walker and R. J. Malik, "Quantum well avalanche multiplication initiated by 10 μm intersubband absorption and photoexcited tunneling," Appl. Phys. Lett. 51, 934 (1987).

In summary the structure of the present invention is based on the energy level splitting induced by coupling between pairs of quantum wells, and the advantage over the prior art is providing for detection of long wavelength IR radiation for which satisfactory detectors did not previously exist. The restrictions on quantum well design parameters are not as severe in the present invention as compared to the prior-art intersubband absorption IR detectors, since an excited state ($E_2$) within a single well is not required. Instead, the second energy level is effectively established by splitting the energy of coupled quantum wells which are provided in pairs. Additional degrees of freedom, and thus flexibility in design parameters, are available by using wells of different widths, asymmetric wells formed by different barrier heights, etc.

Although particular embodiments of the invention have been described and illustrated herein, it is recognized that modifications and variations may readily occur to those skilled in the art. Consequently, it is intended that the claims be interpreted to cover such modifications and variations.

I claim:

1. A devide for infrared detection comprising an even number of quantum wells in a linear array, said quantum wells being paired, each odd numbered quantum well being paired with an adjacent even numbered quantum well, said quantum wells of each pair being coupled by selected spacing between said paired wells, each quantum well comprising a layer of well material bounded on each side by a layer of barrier material with a width and depth of each quantum well selected for a predetermined single energy level such that, when said single energy level is split by coupling between paired quantum wells, an upper and a lower energy level is produced, said selected spacing between paired quantum wells being selected for splitting said single energy level with a difference between said upper and lower energy levels appropriate for detection of infrared radiation of a desired wavelength greater than about 10 μm and up to about 100 μm.

2. A device as defined in claim 1 wherein said paired odd and even numbered quantum wells are selected to have the same width.

3. A device as defined in claim 1 wherein said paired odd and even numbered quantum wells are selected to have different widths for producing asymmetric wave functions and energy level splitting which is not symmetric about a single-well energy level.

4. A device as defined in claim 1 wherein said well material and said barrier material is the same, with doping of said well material using N-type impurities, and doping of said barrier material using P-type impurities, thereby creating conduction band discontinuities between layers of said quantum well material and said barrier material.

5. A device as defined in claim 1 wherein said well material is GaAs, and said barrier material is $Al_x Ga_{1-x}As$.

6. A device as defined in claim 5 wherein the depth of said paired quantum wells is 50 meV and the width of said paired quantum wells is 70 Å, the concentration x of Al in said barrier material is 0.06 for a difference in split energy levels of about 23.4 meV for a minimum spacing of about 14 Å, and the spacing between wells is selected from a range of about 14 Å to about 42.5 Å for radiation detection in a range of about 53 μm to about 95.4 μm.

7. A device as defined in claim 5 wherein the depth of said paired quantum wells is 100 meV, the width of said quantum wells is 42.5 Å, the concentration x of Al in said barrier material is made greater than 0.06 for a difference in split energy levels of about 46.6 meV for a minimum spacing of about 14 Å, and the spacing between wells is selected from a range of about 14 Å to about 36.8 Å for radiation detection in a range of about 26.6 μm to about 50 μm.

* * * * *